(12) United States Patent
Yun et al.

(10) Patent No.: US 7,236,295 B2
(45) Date of Patent: Jun. 26, 2007

(54) BROADBAND LIGHT SOURCE

(75) Inventors: In-Kuk Yun, Suwon-si (KR);
Jeong-Seok Lee, Anyang-si (KR);
Seung-Woo Kim, Seoul (KR);
Seong-Taek Hwang, Pyeongtaek-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 159 days.

(21) Appl. No.: 10/874,429

(22) Filed: Jun. 23, 2004

(65) Prior Publication Data

US 2005/0185262 A1  Aug. 25, 2005

(30) Foreign Application Priority Data

Dec. 18, 2003  (KR) ............... 10-2003-0092986

(51) Int. Cl.
*H01S 5/50* (2006.01)
(52) U.S. Cl. .................................... 359/344
(58) Field of Classification Search ........... 359/344; 372/50.23, 50.121, 50.22
See application file for complete search history.

(56) References Cited

U.S. PATENT DOCUMENTS

| | | | | |
|---|---|---|---|---|
| 3,584,230 A * | 6/1971 | Tien | ............. | 398/141 |
| 3,621,459 A * | 11/1971 | Reeves | ............. | 372/39 |
| 3,704,427 A * | 11/1972 | Heywang | ............. | 372/44.01 |
| 4,493,086 A * | 1/1985 | Jain et al. | ............. | 372/21 |
| 4,736,164 A * | 4/1988 | Henning | ............. | 359/344 |
| 5,151,908 A * | 9/1992 | Huber | ............. | 372/6 |
| 5,310,720 A * | 5/1994 | Shin et al. | ............. | 359/344 |
| 5,315,609 A * | 5/1994 | Tanaka et al. | ............. | 372/50.23 |
| 5,321,718 A * | 6/1994 | Waarts et al. | ............. | 372/108 |
| 5,974,065 A * | 10/1999 | Kanda | ............. | 372/50.23 |
| 5,986,790 A * | 11/1999 | Ota et al. | ............. | 398/1 |
| 6,046,842 A * | 4/2000 | Tiemeijer | ............. | 359/344 |
| 6,091,743 A * | 7/2000 | Yang | ............. | 372/6 |
| 6,124,966 A * | 9/2000 | Yokoyama | ............. | 359/339 |
| 6,188,708 B1 * | 2/2001 | Schmitt et al. | ............. | 372/50.22 |
| 6,195,200 B1 * | 2/2001 | DeMarco et al. | ............. | 359/337.21 |
| 6,381,066 B1 * | 4/2002 | Korn et al. | ............. | 359/344 |
| 6,507,430 B2 * | 1/2003 | Yenjay | ............. | 359/341.31 |
| 6,549,331 B2 * | 4/2003 | Walker et al. | ............. | 359/344 |
| 6,567,430 B1 * | 5/2003 | Islam et al. | ............. | 372/3 |
| 6,614,590 B2 * | 9/2003 | Tatoh | ............. | 359/344 |
| 6,658,189 B2 * | 12/2003 | Ajima et al. | ............. | 385/123 |
| 6,751,241 B2 * | 6/2004 | Davis et al. | ............. | 372/6 |
| 6,862,136 B2 * | 3/2005 | Koren et al. | ............. | 359/344 |
| 6,900,885 B2 * | 5/2005 | Masuda et al. | ............. | 356/147 |
| 2001/0036204 A1 * | 11/2001 | Hatta et al. | ............. | 372/6 |
| 2002/0009107 A1 * | 1/2002 | Miyokawa et al. | ............. | 372/36 |
| 2002/0012370 A1 * | 1/2002 | Ishimaru | ............. | 372/36 |
| 2002/0131695 A1 * | 9/2002 | Masuda et al. | ............. | 385/27 |

(Continued)

*Primary Examiner*—Jack Keith
*Assistant Examiner*—Ari M. Diacou
(74) *Attorney, Agent, or Firm*—Cha & Reiter, LLC

(57) ABSTRACT

A broadband light source is disclosed. The broadband light source includes a semiconductor optical amplifier for generating and amplifying light of a broadband wavelength, the amplifier having a first end and a second end and a mirror spaced from the second end of the semiconductor optical amplifier to reflect the light, which is provided by the semiconductor optical amplifier, back to the semiconductor optical amplifier, wherein the semiconductor optical amplifier amplifies the light reflected from the mirror and outputs the amplified light to the first end of the semiconductor optical amplifier. The light source further including at least one lens system to converge light passing through the amplifier ends.

23 Claims, 6 Drawing Sheets

U.S. PATENT DOCUMENTS

| | | |
|---|---|---|
| 2003/0007534 A1* | 1/2003 | Kanemaru et al. ............ 372/50 |
| 2003/0068125 A1* | 4/2003 | Yoshida et al. ............... 385/27 |
| 2003/0072076 A1* | 4/2003 | Yoon et al. ................. 359/344 |
| 2005/0078359 A1* | 4/2005 | Kim et al. .................. 359/344 |
| 2005/0105171 A1* | 5/2005 | Shin et al. .................. 359/344 |
| 2005/0201675 A1* | 9/2005 | Knopp et al. ................. 385/27 |

* cited by examiner

BROADBAND LIGHT SOURCE

CLAIM OF PRIORITY

This application claims priority, pursuant to 35 U.S.C. §119, to that patent application entitled "Broadband Light Source" filed in the Korean Intellectual Property Office on Dec. 18, 2003 and assigned Serial No. 2003-92986, the contents of which are hereby incorporated by reference.

BACKGROUND OF THE INVENTION

1. Field of the Invention

The present invention relates to a light source, and more particularly to a light source having a low ripple and high gain.

2. Description of the Related Art

A wavelength-division multiplexed passive optical network (hereinafter, referred to as "WDM-PON") is a communication system for connecting a plurality of subscribers with a central office through an optical fiber. This system is also advantageous as it can easily expand communication lines. The WDM-PON includes a central office for generating downstream optical signals, a plurality of subscribers for receiving the downstream optical signals and a remote node linked to the central office through a single optical fiber and connected to each of the subscribers. The system also allows the users to transmit respective upstream optical signals to the central office.

The remote node demultiplexes the downstream optical signals received from the central office according to the respective wavelengths and outputs the demultiplexed optical signals to corresponding subscribers. Also, the remote node multiplexes the upstream optical signals inputted from the respective subscribers and outputs the multiplexed optical signals to the central office.

In the above-mentioned WDM-PON, it is necessary that the central office generate a plurality of downstream optical signals having different wavelengths in order to provide the respective downstream optical signals to each of the subscribers.

An optical transmitter for generating the downstream optical signals may include a plurality of laser light sources capable of generating optical signals having different wavelengths. The optical transmitter may also include either a spectrum-sliced light source or a wavelength-locked light source. The spectrum-sliced light source divides light of a broadband wavelength into several channels having different wavelengths, and modulates each of the channels into a downstream optical signal. The wavelength-locked light source generates downstream wavelength-locked optical signals by using each of the channels having different wavelengths.

The spectrum-sliced light source and the wavelength-locked light sources may include a light emitting diode (LED), a superluminescent LED, or an erbium-doped fiber amplifier, or other similar device(s) in order to generate light of a broadband wavelength. The erbium-doped fiber amplifier can stably generate light that has no connection with polarized light. But the erbium-doped fiber amplifier has problems in that it generates only a limited wavelength band and has a large size and a high manufacturing cost.

The LED and the superluminescent LED can generate light of a wide wavelength range but problems are known to incur as they have a low output power and they are influenced by polarized light.

FIG. 1 is a view illustrating a construction of a conventional broadband light source including a reflective semiconductor optical amplifier. As illustrated the conventional broadband light source includes a semiconductor optical amplifier 110, an anti-reflection layer 130 on a first end of the semiconductor optical amplifier 110, and a high-reflection layer 120 on a second end of the semiconductor optical amplifier 110. The semiconductor optical amplifier 110 includes a gain medium 111 for generating spontaneous emission light and clads 112a and 112b formed around the gain medium 111. The spontaneous emission light generated by gain medium 111 is reflected from the high-reflection layer 120 and is outputted to the outside through the anti-reflection layer 130. Hence, the semiconductor optical amplifier 110 amplifies the light reflected from the high-reflection layer and outputs the amplified light to the anti-reflection layer, thereby having an advantage of improving amplification efficiency.

However, because the reflective semiconductor optical amplifier includes the anti-reflection layer 130 coated on the first end and the high-reflection layer 120 coated on the second end, a so-called resonance phenomenon may occur while the light reflected from the high-reflection layer 120 is progressing through the gain medium 111. That is, there is a problem in that as reflectance of the high-reflection increases, the intensity of light amplified in the reflective semiconductor optical amplifier increases, and gain ripple of amplified light increases simultaneously. In a broadband light source for generating light of a broadband wavelength having predetermined flatness, the gain ripple is a primary factor that disturbs the flatness of light outputted from the broadband light source.

SUMMARY OF THE INVENTION

Accordingly, the present invention has been made to solve the above-mentioned problem, and an object of the present invention is to provide a broadband light source capable of outputting light of a broadband wavelength having low gain ripple and a high amplification gain.

To accomplish this object, in accordance with one aspect of the present invention, there is provided a broadband light source comprising a semiconductor optical amplifier provided with a first end and a second end for generating and amplifying light of a broadband wavelength and a mirror spaced from the second end of the semiconductor optical amplifier so as to reflect the light, which has been inputted from the semiconductor optical amplifier, to the semiconductor optical amplifier, wherein, the semiconductor optical amplifier amplifies the light reflected from the mirror and outputs the amplified light to the first end of the semiconductor optical amplifier.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, embodiments of broadband light sources according to the present invention will be described with reference to the accompanying drawings. For purposes of clarity and simplicity, in the following description a detailed description of known functions and configurations will be omitted when it may make the subject matter of the present invention unclear.

Figure 1:
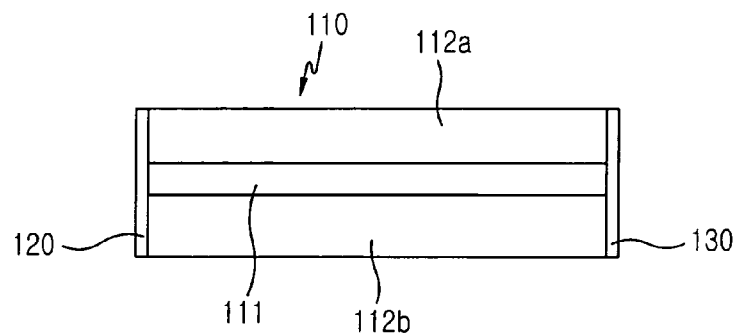
FIG. 1 is a view illustrating a construction of a conventional reflective semiconductor optical amplifier.
Figure 2:
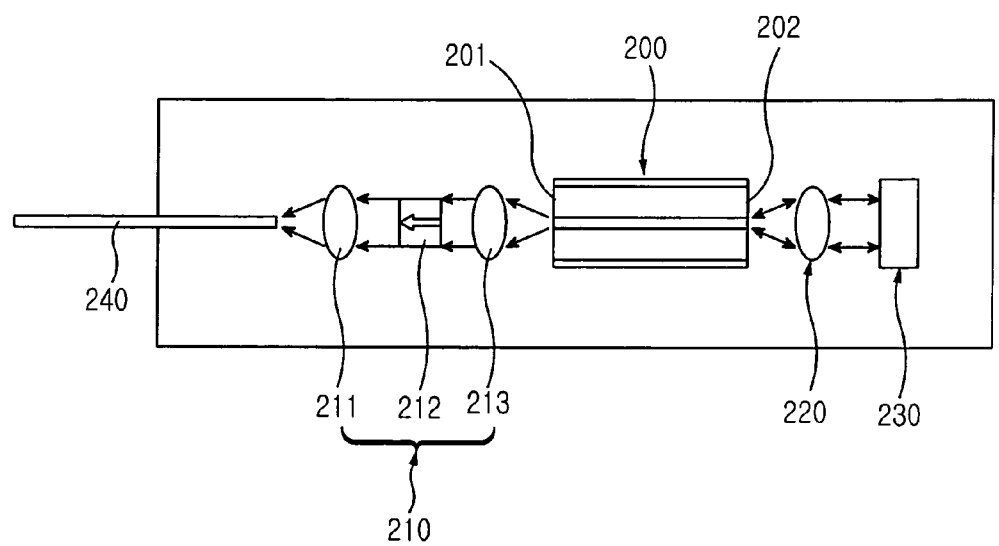
FIG. 2 is a view illustrating a construction of a broadband light source according to a first embodiment of the present invention.

FIG. 2 is a view illustrating a construction of a broadband light source according to a first embodiment of the present invention. As shown, the broadband light source according to the first embodiment of the present invention includes a semiconductor optical amplifier 200 for generating and amplifying light of a broadband wavelength, a mirror 230 for reflecting the light, which has been provided by semiconductor optical amplifier 200, back to semiconductor optical amplifier 200, an optical fiber 240 for outputting the light to the outside of the broadband light source, a first lens system 210, and a second lens system 220.

The semiconductor optical amplifier 200 includes a first end 201 and a second end 202, and generates and amplifies light of a broadband wavelength. Anti-reflection layers a recoated on first end 201 and second end 202 so that the loss of the inputted/outputted light is minimized.

The mirror 230 is spaced from the second end 202 of the semiconductor optical amplifier 200 to reflect back the light provided by semiconductor optical amplifier to the semiconductor optical amplifier.

Gain ripple is caused because light generated from a gain medium of the semiconductor optical amplifier 200 repeatedly travels within the inside of the gain medium so that coherence due to a Fabry-Perot mode can develop. In addition, the gain ripple may increase as the reflectance of first end 201 and second end 202 of the semiconductor optical amplifier 200 increases.

The mirror 230 is spaced from the semiconductor optical amplifier 200 by a predetermined interval to cancel the coherence of light outputted from the semiconductor optical amplifier 200 while the light is progressing toward the mirror 230. In this case it is possible to reflect the light having sufficient intensity to the semiconductor optical amplifier 200 without an anti-reflection layer formed on the second end 202 of the semiconductor optical amplifier 200. For an example, the mirror 230 may be spaced from the semiconductor optical amplifier 200 by an interval of 10 mm, which is longer than a coherence length of the light generated from the semiconductor optical amplifier 200.

The first lens system 210 includes a first lens 211, a second lens 213, and an isolator 212 located between the first and the second lens. First lens system 210 collimates and converges the light outputted through first end 201 into the optical fiber 240.

More specifically, first lens 211 converges the light generated by semiconductor optical amplifier 200 onto optical fiber 240. The second lens 213 is located opposite first end 201 and collimates the light outputted through the first end 201 of the semiconductor optical amplifier 200 and provides the collimated light to the first lens 211.

Isolator 212 is positioned between the first lens 211 and the second lens 213 to transmit the light collimated and provided by the second lens 213 to the first lens 211. Isolator 212 prevents light from being reflected from first lens 212 back into the second lens 213.

Second lens system 220 is located between the second end 202 and the mirror 230 and is used to collimate and transmit light provided by semiconductor optical amplifier 200 to the mirror 230. Second lens system 220 further converges light reflected from the mirror 230 back into the second end 202 of the semiconductor optical amplifier 200.

Figure 3:
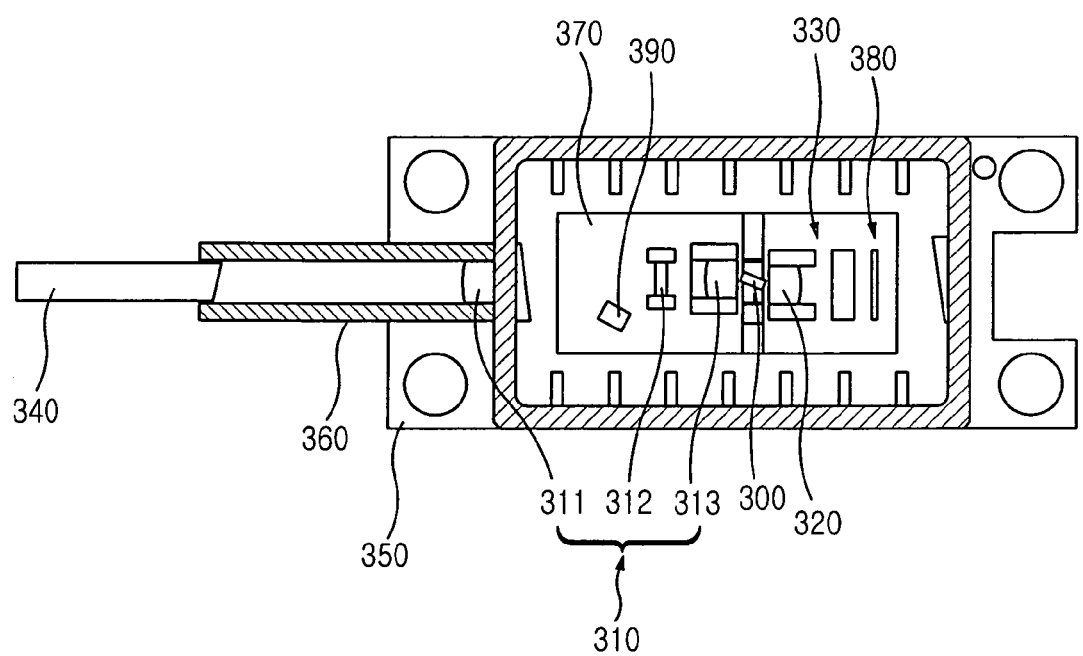
FIG. 3 is a view illustrating a construction of a broadband light source according to a second embodiment of the present invention.

FIG. 3 is a top view illustrating a construction of a broadband light source according to the present invention. As shown, the broadband light source according to this second embodiment of the present invention includes a housing 350 containing a substrate 370 disposed on a base surface of the housing 350, a semiconductor optical amplifier 300, a mirror 380, an optical fiber 340, a first lens system 310 located between the optical fiber 340 and the semiconductor optical amplifier 300, a second lens system 320, an optical detector 390, and a Faraday rotator 330.

In this illustrated embodiment, the substrate 370 is disposed on the base surface of the housing 350, and the semiconductor optical amplifier 300 and the other described elements are disposed, fabricated, deposited or placed on substrate 370.

The semiconductor optical amplifier 300 operates to generate and amplify light of a broadband wavelength and to output the amplified light through both ends of the semiconductor optical amplifier 300. The first lens system 310 is located between the optical fiber 340 and a first end of the semiconductor optical amplifier 300, and includes a first lens 311, a second lens 313, and isolator 312. The first lens 311 converges light amplified in the semiconductor optical amplifier 300 into the optical fiber 340. The second lens 313 collimates and outputs the light provided by the first end of the semiconductor optical amplifier 300. The isolator 312 is located between the first lens 311 and the second lens 313 to permit the light collimated by the second lens 313 to be transmitted to the first lens 311 and to prevent light from being inputted into the second lens 313 from the first lens 311, as previously described.

The second lens system 320 is located between the semiconductor optical amplifier 300 and mirror 380 as is used to collimate light outputted from the semiconductor optical amplifier 300, to transmit the collimated light to the mirror 380, and to converge light reflected from the mirror 380 back into the semiconductor optical amplifier 300.

The optical fiber 340 is fixed at one side of the hosing 350, and outputs light amplified in the semiconductor optical amplifier 300 to the outside of the broadband light source.

The optical detector 390 is located at one side of the first lens system 310 and is used to detect the intensity of light passing first lens system 310. The Faraday rotator 330 is located between the second lens system 320 and the mirror 380 so as to control a polarization mode of the light.

Figure 4:
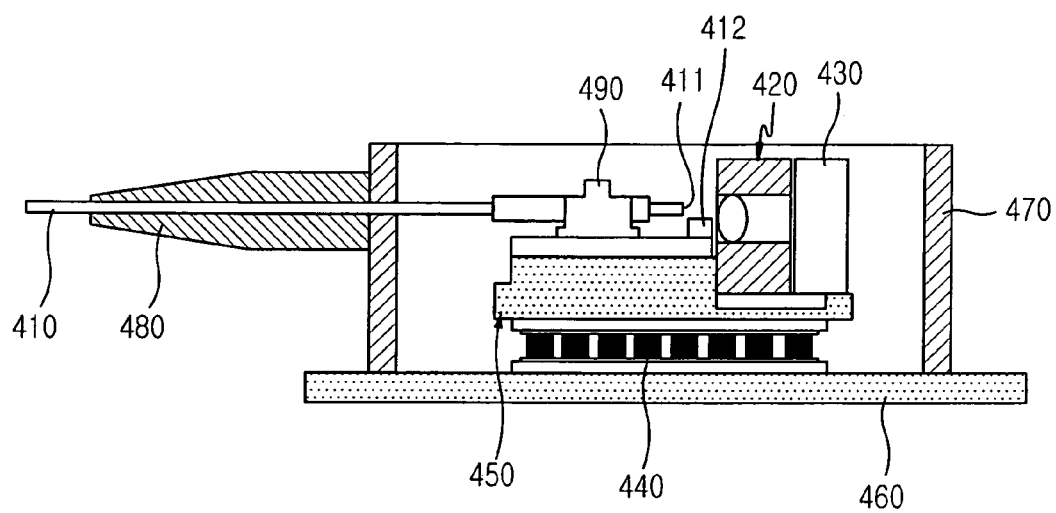
FIG. 4 is a view illustrating a construction of a broadband light source according to a third embodiment of the present invention.

FIG. 4 is a side-view illustrating a construction of a broadband light source according to the present invention. As shown, the broadband light source according to this embodiment of the present invention includes a housing 460 containing a substrate 450 disposed over the base surface of the housing 460, a thermal electric cooling device 440 interposed between the housing 460 and the substrate 450, a semiconductor optical amplifier 412 for generating and amplifying broadband light to output the amplified light to both end sides, a mirror 430, an optical fiber 410 for outputting the light to the outside of the broadband light source, and a lens system 420 for converging light reflected from the mirror 430 into the semiconductor optical amplifier 412. Hereinafter, parts and functions already describe with regard to other embodiments with not again be described in order to avoid redundancy.

The optical fiber 410 is located directly opposite to one end of the semiconductor optical amplifier 412. In this exemplary embodiment a separate optical system, or similar device for converging light outputted through the one end of the semiconductor optical amplifier 412 into the optical fiber 410 is not necessary. The optical fiber 410 is fixed at one side of the housing 460 by means of a first holder 480, and is fixed on the substrate 450 by means of a second holder 490.

The thermal electric cooling device 440 is located between the substrate 450 and the base surface of the housing 460 and is used to control temperature of the broadband light source.

The lens system 420 collimates and converges transmitted light between the semiconductor optical amplifier 412 and the mirror 430, as previously described.

Figure 5:
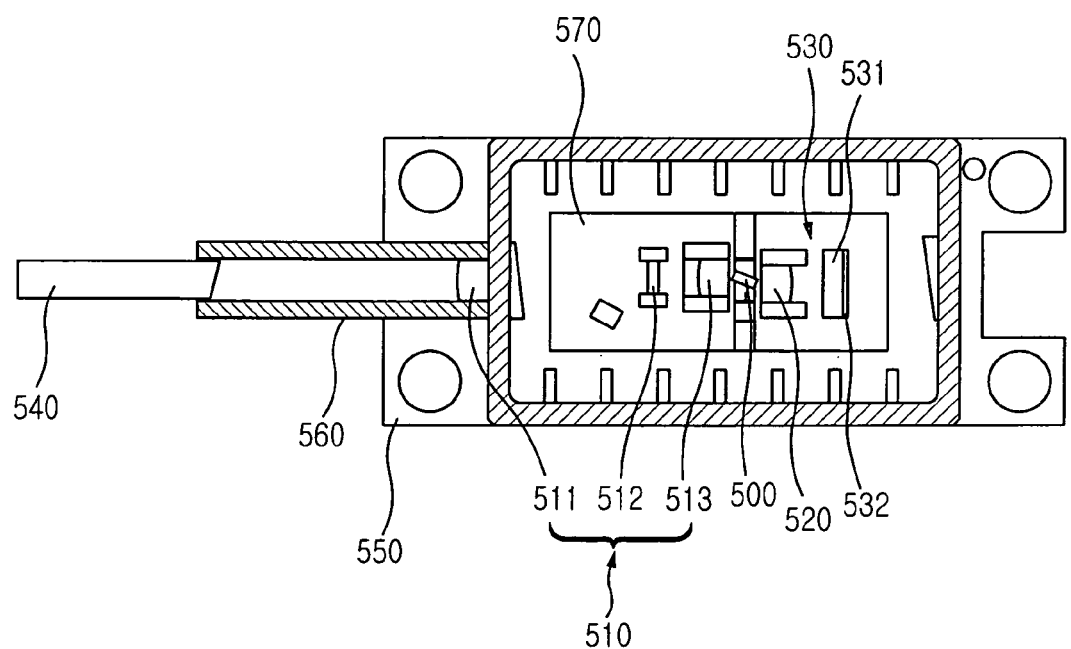
FIG. 5 is a view illustrating a construction of a broadband light source according to a fourth embodiment of the present invention.

FIG. 5 is a top-view illustrating a construction of a broadband light source according to a fourth embodiment of the present invention. As shown, the broadband light source according to the fourth embodiment of the present invention includes a housing 550 containing a substrate 570 disposed on a base surface of the housing 550, a semiconductor optical amplifier 500 for generating light of a broadband wavelength, a mirror section 530, an optical fiber 540, a first lens system 510 located between the optical fiber 540 and the semiconductor optical amplifier 500, and a second lens system 520. Hereinafter, parts and functions already discussed will not be discussed with regard to this embodiment in order to avoid redundancy.

The mirror section 530 includes an optical detector 531 and a mirror 532 deposited on one end of the optical detector 531, and is located opposite to one end of the semiconductor optical amplifier 500. Mirror section 530 monitors the intensity of light provided by semiconductor optical amplifier 500 and reflects the provided light back to the semiconductor optical amplifier 500 through lens system 520.

Figure 6:
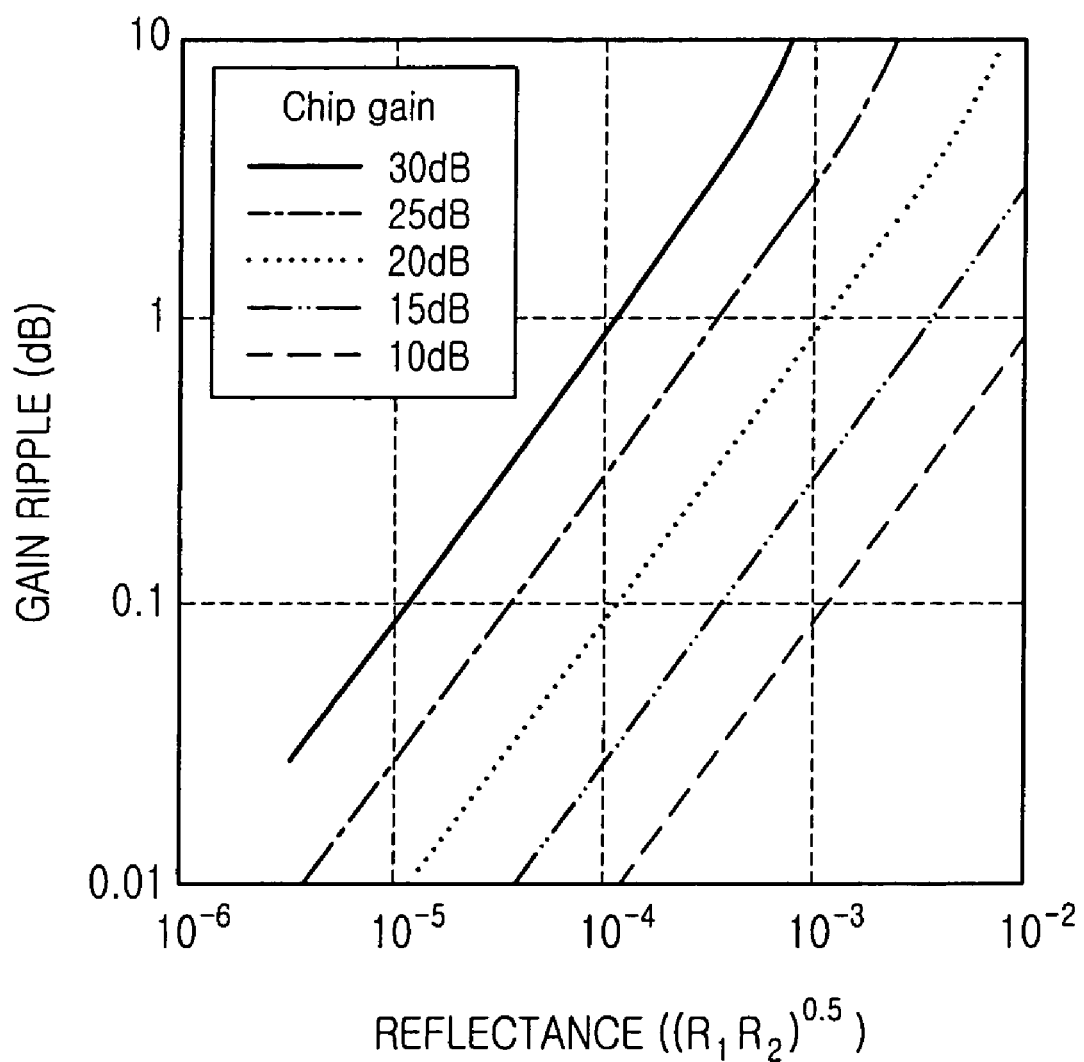
FIG. 6 is a graph showing gain ripple according to gains and end-surface reflectance of a semiconductor optical amplifier.
Figure 7:
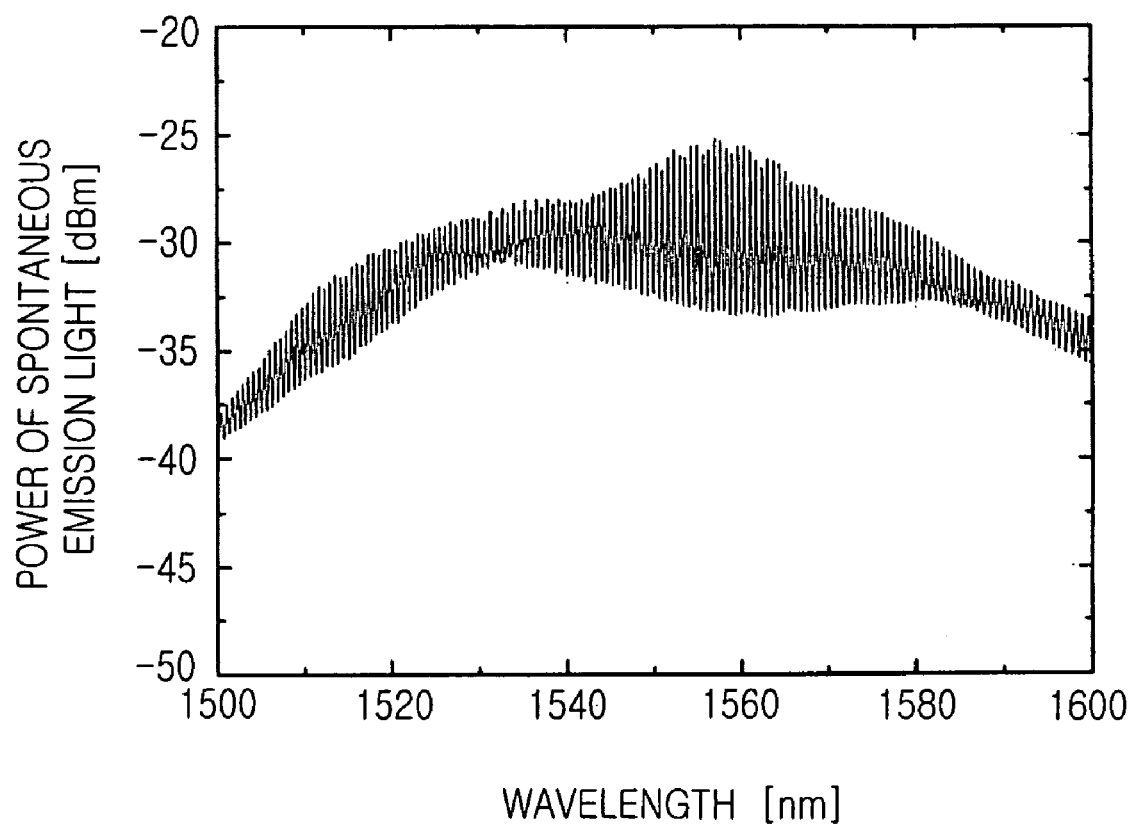
FIG. 7 is a graph showing a spectrum of a conventional reflective semiconductor optical amplifier.

FIG. 6 represents a graph showing gain ripple according to gains and end-surface reflectance of a semiconductor optical amplifier, and FIG. 7 represents a graph showing a spectrum of a conventional reflective semiconductor optical amplifier. Referring to FIGS. 6 and 7, it can be recognized by those skilled in the art that both ends of a semiconductor optical amplifier must have low reflectance in order to obtain a high output gain and low gain ripple in the semiconductor optical amplifier. For example, it can be understood that if a value is obtained by multiplying a reflectance value ($R_1$) at one end of the semiconductor optical amplifier by a reflectance value ($R_2$) at the other end of the semiconductor optical amplifier, i.e., ($R_1 R_2$), is less than $10^{-8}$, and the output gain of the semiconductor optical amplifier is 30 dB, gain ripple is identical to or less than 0.5 dB. When it is considered that reflectance of a high-reflection layer is 30% or more in a normal reflective semiconductor optical amplifier, reflectance of an output side of the reflective semiconductor optical amplifier must be less than $10^{-7}$. However, the minimum reflectance of an anti-reflection layer to be formed on the one end of a semiconductor optical amplifier is $10^{-5}$, so that large gain ripple is caused in an available reflective semiconductor optical amplifier. Note that FIG. 6 is displayed with respect to $(R_1 R_2)^{0.5}$.

With a broadband light source according to the present invention, anti-reflection layers are coated on a first and a second end of a semiconductor optical amplifier, respectively, and a mirror positioned opposite to the second end is included, so that it is possible to lower the gain ripple of light amplified in the semiconductor optical amplifier and simultaneously to improve amplification gain.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A broadband light source comprising:
   a semiconductor optical amplifier to configured generate and amplify light of a broadband wavelength, said optical amplifier having a first end having an reflectance coating index $R_1$ and a second end having an reflectance coating index $R_2$;
   a mirror being spaced from the second end of the semiconductor optical amplifier and being configured to reflect the light, which is provided from the semiconductor optical amplifier, back to the semiconductor optical amplifier, wherein the semiconductor optical amplifier is configured to amplify the light reflected from the mirror and to output the amplified light to the first end of the semiconductor optical amplifier; and
   a lens system being located between the mirror and the second end of the semiconductor optical amplifier, being configured to collimate the light provided from the semiconductor optical amplifier to the mirror, and being configured to converge the light reflected from the mirror into the second end of the semiconductor optical amplifier.

2. The broadband light source as claimed in claim 1, further comprising:
   an optical fiber configured to output the light, which is outputted through the first end of the semiconductor optical amplifier, to the outside of the broadband light source; and
   a first lens system located between the optical fiber and the first end of the semiconductor optical amplifier.

3. The broadband light source as claimed in claim 2, wherein, the first lens system includes:
   a first lens configured to converge light amplified in the semiconductor optical amplifier into the optical fiber;
   a second lens being located opposite to the first end of the semiconductor optical amplifier and being configured to collimate light outputted through the first end of the semiconductor optical amplifier; and
   an isolator located between the first lens and the second lens, the isolator being configured to transmit the light, the light collimated through the second lens, to the first lens and configured to prevent light from being reflected back into the second lens.

4. The broadband light source as claimed in claim 1, further comprising:
   a Faraday rotator located between the lens system and the mirror, the Faraday rotator configured to maintain a known polarization of light provided from the second end of the semiconductor optical amplifier and reflected back from the mirror.

5. The broadband light source as claimed in claim 1, wherein an interval between the semiconductor optical amplifier and the mirror is longer than a coherence length of the light generated in the semiconductor optical amplifier.

6. The broadband light source as claimed in claim 1, wherein a reflectivity factor is determined as $R_1R_2$.

7. The broadband light source as claimed in claim 6, wherein the reflectivity factor is based on the amplifier gain.

8. The broadband light source as claimed in claim 1, wherein the mirror further comprises:
   a reflective surface; and
   an optical detector positioned between the reflective surface and the second end.

9. The broadband light source as claimed in claim 2, further comprising:
   an optical detector configured to detect light intensity.

10. The broadband light source as claimed in claim 1, further comprising:
    a thermo-cooler configured to maintain the amplifier at a known temperature.

11. A broadband light source including a housing, on a base surface of which a substrate is disposed, the broadband light source comprising:
    a semiconductor optical amplifier, having a first end and a second end, being disposed on the substrate, being configured to generate and amplify broadband light and being configured to output the amplified light through the first and second ends of the semiconductor optical amplifier;
    a mirror being located opposite to the second end of the semiconductor optical amplifier on the substrate and being configured to reflect light, which is provided from the semiconductor optical amplifier, back to the second end of the semiconductor optical amplifier;
    an optical fiber fixed at one side of the housing to output the light inputted through the first end of the semiconductor optical amplifier outside of the broadband light source;
    a first lens system being located between the optical fiber and the semiconductor optical amplifier being configured to converge light amplified in the semiconductor optical amplifier into the optical fiber; and
    a second lens system being located between the semiconductor optical amplifier and the mirror, being configured to collimate and transmit light outputted from the semiconductor optical amplifier to the mirror, and being configured to converge light reflected from the mirror into the semiconductor optical amplifier.

12. The broadband light source as claimed in claim 11, wherein the first lens system includes:
    a first lens configured to converge light amplified in the semiconductor optical amplifier into the optical fiber;
    a second lens configured to collimate and output light inputted from the first end of the semiconductor optical amplifier; and
    an isolator being located between the first lens and the second lens, configured to transmit the light collimated through the second lens to the first lens, and configured to prevent light from being reflected by the first lens back to the second lens.

13. The broadband light source as claimed in claim 11, further comprising:
    an optical detector being located at one side of the first lens system and being configured to detect the intensity of light passing through the first lens system.

14. The broadband light source as claimed in claim 11, further comprising:
    a Faraday rotator located between the second lens system and the mirror.

15. The broadband light source as claimed in claim 11, wherein the mirror further comprises:
    a reflective surface; and
    an optical detector positioned between the second end and the reflective surface.

16. The broadband light source as claimed in claim 11, wherein the first and second ends are coated with a material having reflectivity indices $R_1$ and $R_2$, respectively.

17. The broadband light source as claimed in claim 16, wherein a reflectivity factor is determined as a function of $R_1R_2$.

18. A broadband light source including a housing, on a base surface of which a substrate is disposed, the broadband light source comprising:
    a thermal electric cooling device interposed between the housing and the substrate;
    a semiconductor optical amplifier, having a first end and a second end, being disposed on the substrate, being configured to generate and amplify broadband lights, and being configured to output the amplified light to the first and second ends;
    a mirror being located opposite to the second end of the semiconductor optical amplifier on the substrate, and being configured to reflect light, which is provided by the semiconductor optical amplifier, back to the second end of the semiconductor optical amplifier;
    an optical fiber being fixed at one side of the hosing and being configured to output the light provided by the first end of the semiconductor optical amplifier to the outside of the broadband light source; and
    a first lens system being located between the optical fiber and the semiconductor optical amplifier and being configured to converge light amplified in the semiconductor optical amplifier into the optical fiber.
    a second lens system being positioned between the second end and the mirror, being configured to collimate the light provided from the semiconductor optical amplifier to the mirror, and being configured to converge the light reflected from the mirror into the second end of the semiconductor optical amplifier.

19. The light source as claimed in claim 18, further comprising:
    an optical detector configured to measure light intensity passing through the lens system.

20. The light source as claimed in claim 18, wherein the mirror comprises:
    a reflective surface; and
    an optical detector.

21. The light source as claimed in claim 18, further comprising:
    a polarizer.

22. The light source as claimed in claim 18, wherein the first and second ends are coated with a coating having reflective indices $R_1$ and $R_2$, respectively.

23. The light source as claimed in claim 22, wherein a reflective factor is determined as a function of $R_1R_2$.

* * * * *